(12) United States Patent
Yamashita

(10) Patent No.: US 6,497,744 B2
(45) Date of Patent: Dec. 24, 2002

(54) APPARATUS AND METHOD FOR GENERATING INDIUM ION BEAM

(75) Inventor: Takatoshi Yamashita, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/986,624

(22) Filed: Nov. 9, 2001

(65) Prior Publication Data
US 2002/0056342 A1 May 16, 2002

(30) Foreign Application Priority Data
Nov. 10, 2000 (JP) ........................ 2000-343395

(51) Int. Cl.$^7$ ................................................ C22B 4/08
(52) U.S. Cl. ........................ 75/10.29; 361/230
(58) Field of Search .................... 75/10.29; 361/230

(56) References Cited

FOREIGN PATENT DOCUMENTS

| EP | 1073087 A2 * | 1/2001 | ............ H01J/27/14 |
|---|---|---|---|
| GB | 2 360 390 A | 9/2001 | |
| GB | 2 365 203 A | 2/2002 | |
| JP | 3-13576 | 1/1991 | |
| JP | 11-339674 | 12/1999 | |
| JP | 2001-202896 | * 7/2001 | ............ H01J/27/02 |

OTHER PUBLICATIONS

Search Report dated Apr. 22, 2002 from the United Kingdom Patent Office in corresponding UK application No. GB 0127052.9.

* cited by examiner

Primary Examiner—Roy King
Assistant Examiner—Tima McGuthry Banks
(74) Attorney, Agent, or Firm—Finnegan, Henderson, Farabow, Garrett & Dunner LLP

(57) ABSTRACT

An ion source 2 has a heating furnace 4 for annealing a solid material 6 to generate a steam 8 and a plasma generator 16 for ionizing the steam 8 to generate a plasma 24. The ion source 2 is for generating ion beam. An indium trifluoride is used as said solid material which has been once heated at temperature in the range of 600° C. to lower than 1170° C., thereby enabling to generate the indium ion beam in a stable amount. For the solid material 6, $In(OF)_xF_{3-x}$ (x is 1, 2 or 3) may be used.

9 Claims, 2 Drawing Sheets

APPARATUS AND METHOD FOR GENERATING INDIUM ION BEAM

BACKGROUND OF THE INVENTION

The present invention relates to a method and an apparatus of generating an indium ion beam from an ion source, which is applied to, such as an ion beam irradiating apparatus as an ion implantation apparatus. The present invention especially relates to a method and an apparatus of generating an indium ion beam in a stable amount.

The indium ion has been noticeable in a technical field of production of semi-conductors. Japanese Patent Unexamined Publication No. Hei 03-13576 describes a method of generating an indium ion beam from an ion source, comprising the steps of pre-annealing a heating furnace (carbon container) including an indium iodide therein at temperature in the range of 100 to 200° C., increasing the temperature of the heating furnace at 300 to 500° C. to vaporize the indium iodide, introducing the steam of the indium iodide vaporized the indium iodide into a plasma generator (discharging chamber) to ionize it therein by an arc discharge and thus generates plasma, and deriving an indium ion beam from this plasma.

But, in this method, since a melting point of the indium iodide is at 210° C., if the heating furnace is operated at 300 to 500° C. as mentioned, the indium iodide is completely melted into a liquid. As a result, the heating furnace, the plasma generator, and further a steam introducing pipe between both and the like are adhered with the liquidized indium iodide being like mucus. Therefore, the inside of the heating furnace, the plasma generator, and the steam introducing pipe are smudged by the liquidized indium iodide being like mucus. The steam pipe is clogging, so that the indium ion beam cannot be taken out stably.

Besides, owing to smudging, the heating furnace, the plasma generator, and the steam introducing pipe must be cleaned or exchanged frequently. For example, each time when the operation of the ion source is stopped, the heating furnace, the plasma generator, and the steam introducing pipe must be cleaned or exchanged. This is practically intolerable.

On the other hand, an inventor of this invention find the following steps for generating the indium ion beam, while avoiding the pipe from adhering the liquidized indium trifluoride and avoiding the heating furnace, the plasma generator, and the steam introducing pipe therebetween from smudging and clogging.

A first step is pre-annealing of the indium trifluoride at 250 to 450° C. for removing water content. The indium trifluoride as a solid material is introduced at the heating furnace. A second step is to increase the temperature of the heating furnace from 450° C. to lower than 1170° C. of the melting point of the indium trifluoride for vaporization of the indium trifluoride. A third step is to introduce the steam of the indium trifluoride into. a plasma generator. A forth step is ionizing the steam of the indium trifluoride by an arc discharge to generate a plasma. A fifth step is deriving the indium ion beam from the plasma.

But, it was found that there still remained rooms as mentioned below for improving the above mentioned method employing the indium trifluoride as the solid material.

The vapor pressure of the indium trifluoride becomes very high by presence of water content. When the water content contained in the indium trifluoride is much, the steam amount of the indium trifluoride becomes more. Therefore, the amount of the indium ion is much, since the ionized steam amount of the indium trifluoride is increasing.

When the temperature of the heating furnace is constant, the steam amount of the indium trifluoride goes down in a short time together with lost of the water content contained in the indium trifluoride. Therefore, the amount of the indium ion beam generated from the ion source also goes down. For example, the amount of the indium ion beam decreases 20% to 70% of an initial amount (i.e., at starting time) in an hour after starting the generation thereof.

One example is shown in FIG. 2 as a comparative example. FIG. 2 shows changes in the amount of the indium ion beam accompanying with passing time from generating the indium ion beam, when the temperature of the heating furnace was maintained constant. The amount of the indium ion beam rapidly goes down until about 30% of the initial amount in one hour after the indium ion beam starts to generate in the comparative example. In the comparative example an indium trifluoride anhydride is used as the solid material, and the pre-annealing is performed at 450° C. for one hour.

Such rapid decrease in the amount of the indium ion beam is not preferable. For example, this makes difficult in the ion source to control the amount of the indium ion beam generated therefrom and control an implantation amount of the indium ion, when the indium ion beam is applied to the ion implantation.

More specifically, the amount of the indium ion beam rapidly goes down, even if the temperature of the heating furnace for compensation for decreasing the amount of the indium ion beam is increasing, the amount of the indium ion beam again rapidly goes down. Such repetition goes on and the amount of the indium ion beam is not stabilized indefinitely. For instance, it takes 3 to 4 days for stabilizing the amount of the indium ion beam. It is not practical use.

For using the indium trifluoride, in spite of pre-annealing at 250 to 450° C. to remove the water content, the problem as mentioned above has been present.

For using a substance called as an indium trifluoride anhydride, which contains no water, the similar tendency has existed as mentioned.

SUMMARY OF THE INVENTION

It is an object of the invention to provide an apparatus and a method enabling to generate the indium ion beam in a stable amount.

As one of methods of generating the indium ion beam according to the invention, a method of generating an indium ion beam comprises steps of annealing a solid material including an indium compound in a heating furnace to generate a steam therefrom, and ionizing the steam supplied from the heating furnace in a plasma generator for ionizing the steam supplied from the heating furnace to generate plasma. In this method it is characterized by using an indium trifluoride as said solid material which is pre-annealed at a temperature in the range of 600° C. to lower than 1170° C. in the furnace.

The invention is included as mentioned above, and has the following effects.

It is possible to remove unstable factors in the vaporizing amount of the solid material included the indium compound so that the indium ion beam can be generated in the stable amount. As a result, the control of the amount of the indium ion beam and the control of the amount of implanting the indium ion using the indium ion beam are very easy.

Passing through various investigations, it is found that the water content contained in the indium trifluoride being the solid material has two types. First is water content merely adhered to the molecule of the indium trifluoride ($InF_3$). This can easily be vaporized by pre-annealing at 250 to 450° C. Only this water content has been studied, so that it has been satisfied with the removal of the water content.

However, it has been found a second of the water content is exited. This is the water content combined with a molecule of the indium trifluoride ($InF_3$) through a molecular combination, namely, the water content of the molecular combination of a formation of $InF_3-x(H_2O)$. x is 1, 2 or 3, and typically 3.

The water content remains after the indium ion beam starts to generate, since the water content of this molecular combination could not be removed by the conventional pre-annealing temperature. Therefore, the water content slowly goes down. It makes unstable the amount of vaporizing the indium trifluoride.

A substance called as the indium trifluoride. anhydride absorbs the water, if it is exposed to an atmospheric air even a little. Since the portion of the water combines with the molecule of the indium trifluoride via molecule combination, it cannot be easily removed.

On the other hand, it has been found that if once pre-annealing the indium trifluoride as the solid matters at 600° C. or higher, the following chemical reaction was rapidly accelerated.

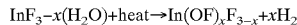

$$InF_3-x(H_2O)+heat \rightarrow In(OF)_xF_{3-x}+xH_2 \quad \text{[Formula 1]}$$

x=1, 2 or 3.

By the reaction, it is possible to rapidly dissolve the water content ($H_2O$ in the left side of the formula) molecule-combined as an unstable factor in the amount of vaporizing the indium trifluoride. "$In(OF)_xF_{3-x}$" in the right side has oxygen but contains no water.

When the indium trifluoride is heated once, the indium trifluoride changed into $In(OF)_xF_{3-x}$ contains no water. Therefore, the vaporizing amount of the indium trifluoride by annealing is stable. It keeps the indium ion beam generating in the stable amount by annealing $In(OF)_xF_{3-x}$ as the solid material in the heating furnace. In other words, the time rate of change in the amount of the indium ion beam respect to a passing time from gegenerating the indium ion beam can be made smaller considerably than in comparison with the related art. The results are shown in FIG. 2 and will be referred to later.

If the annealing temperature of the indium trifluoride is less than 600° C., the reaction of the formula 1 scarcely appears and an effect cannot be obtained.

If the annealing temperature of the indium trifluoride is 1170° C. of the melting point of the indium trifluoride or higher, the indium trifluoride is melted to smudge or clog the heating furnace, the plasma generator and the steam pipe therebetween.

However, if increasing the annealing temperature too high, the effect of causing the reaction of the formula 1 is not changed so much. Accordingly, the pre-annealing temperature of the indium trifluoride is preferably from 600 to 700° C. in the above range, and this temperature range is most practical.

The pre-annealing time of the indium trifluoride depends on annealing temperature. If the annealing temperature is in the range of 600 to 700° C., around 30 to 90 minutes are desirable for the pre-annealing time. It is insufficient to take less than 30 minutes for the pre-annealing time to uniformly heat the whole of the indium trifluoride as the solid material. But if it takes more than 90 minutes, the annealing effect is hardly available and uselessness of time is much. Thus, around one hour is more desirable for the pre-annealing time of the indium trifluoride.

Incidentally, there may be installed a control device for controlling the pre-annealing temperature of the indium trifluoride in the heating furnace, so that the temperature in the heating furnace keeps in the range of 600° C. to less than 1170° C. prior to properly generating the indium ion beam prior to generating the indium ion beam of an predetermined amount. In such a manner, the operation of the ion source may be curtailed otherwise automatized.

In accordance with the above invention, It is possible to remove unstable factors in the vaporizing amount of the solid material included the indium compound so that the indium ion beam can be generated in the stable amount. As a result, the control of the amount of the indium ion beam and the control of the amount of implanting the indium ion using the indium ion beam are very easy, while the ion source can be curtailed or automatized.

Further, as $In(OF)_xF_{3-x}$ is made by the pre-annealing as mentioned above, in substitution for the indium trifluoride, $In(OF)_xF_{3-x}$ (x=1, 2 or 3) may be employed as the solid material to be supplied to the heating furnace, and also in this case a same effect is obtained. Namely, the indium ion beam can be generated in the stable amount.

The invention is included as mentioned above, and has the following effects.

It is possible to remove unstable factors in the vaporizing amount of the solid material included the indium compound so that the indium ion beam can be generated in the stable amount. As a result, the control of the amount of the indium ion beam and the control of the amount of implanting the indium ion using the indium ion beam are very easy.

DETAILED DESCRIPTION OF THE PREFERRED EMBODIMENTS

Figure 1:
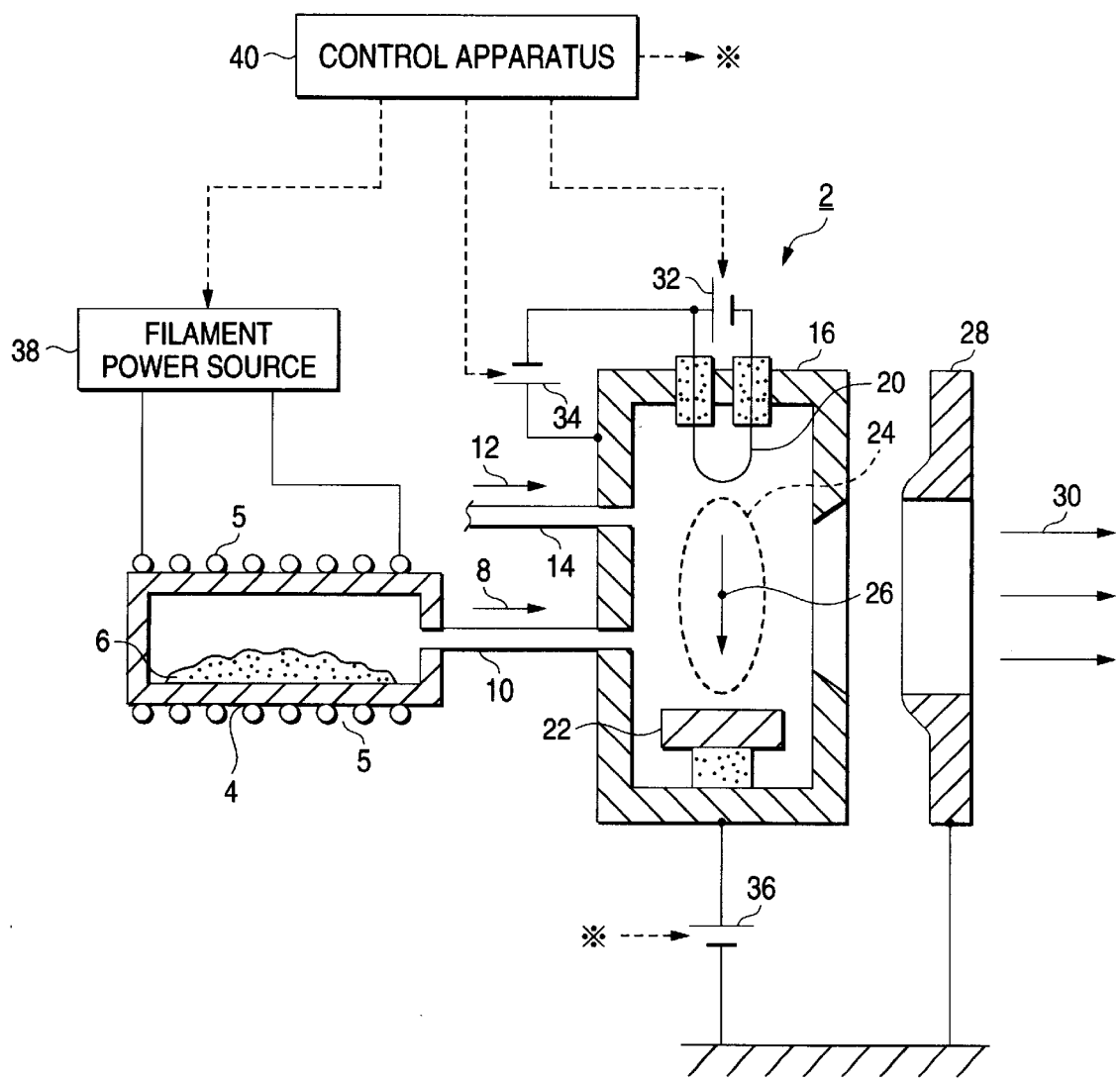
FIG. 1 is a schematic view showing one examples of the ion source and the ion beam generator for practicing the method of generating the indium ion beam according to the invention.

FIG. 1 is schematically showing one examples of the ion source and the ion beam generator for practicing a generating method of the indium ion beam depending on the invention.

An ion beam generator is provided with an ion source 2 for generating ion beam 30 and a control device 40 for controlling the ion source 2.

The ion source 2 is, in this example, equipped with a heating furnace 4 for heating a solid material 6 to generate a steam 8, a steam introducing pipe 10 connecting the heating furnace 4 and a plasma generator 16 to introduce a steam 8 from the heating furnace 4 into the plasma generator 16, the plasma generator 16 for ionizing the steam 8 to be passed through the steam introducing pipe 10 to generate a plasma 24, and a deriving electrode 28 for deriving an ion beam 30 from the plasma 24 within the plasma generator 16 owing to the action of electrical field. Further in this example, there is installed a gas introducing pipe 14 for introducing an auxiliary gas 12 into the plasma generator 16.

The heating furnace 4 has, in this example, a heater 5 to be heated by electric conduction from a heat source 38.

The plasma generator 16 comprises at one side with a filament 20 for discharging thermoelectron and at the other side with a repeller electrode 22 for reflecting an electron. The plasma generator 16 is impressed in the interior with a magnetic field 26 for complementing an electron from an exterior. The ion source 2 of such a structure is called as a burnus type ion source.

The filament 20 is heated by a filament power source 32. An arc voltage for arc discharge is supplied from the arc power source 34 between the filament power source 32 and the plasma generator 16 as an anode. A leading voltage for deriving the ion beam is supplied from a leading power source 36 between the plasma generator 16 and a deriving electrode 28. The power sources 32, 34, 36 and the annealing power source 38 are controlled by the control device 40 in this example.

One operating way of the ion beam generator shown in FIG. 1 having the ion source 2 is shown. The indium trifluoride is introduced as the solid material 6 into the heating furnace 4 of the ion source 2. The indium trifluoride anhydride is used preferably, since the pre-annealing time can be shortened.

Before deriving the indium ion beam of the predetermined amount from the ion source 2 (this indium ion beam is contained in the ion beam 30) the heating furnace 4 is electrically supplied to increase the temperature until, e.g., 600 to 700° C. for the pre-annealing (pre-baking) of the indium trifluoride. For example, it takes about one hour for the pre-annealing of the indium trifluoride.

The pre-annealing may be done before generation of the ion beam 30. The pre-annealing may be done while generating an inert gas ion beam as the ion beam 30. To explain the latter case, an argon gas as an auxiliary gas 12 is led into the plasma generator 16 and the filament 20 at the same time is heated to impress the arc voltage from the arc power source 34 for generating the arc discharge within the plasma generator 16. The plasma 24 is generated in the plasma generator 16. Therefore, an argon ion beam is derived as the ion beam 30 from the plasma 24.

Under this condition, the temperature of the heating furnace 4 is heightened until the above mentioned temperature so as to carry out the pre-annealing of the indium trifluoride. In such a way, the interior of the plasma generator 16 is not smudged by the steam 8, which is generated by the pre-annealing.

The steam 8 of the indium trifluoride is generated during the pre-annealing. The steam 8 of the indium trifluoride led into the plasma generator 16 is ionized so that the indium ion is contained in the plasma 24. Therefore, the indium ion beam is contained in the ion beam 30. But at the beginning of the pre-annealing, for the above mentioned reason, the amount of the indium ion beam is not made stable. That is, if the temperature of the heating furnace 4 is kept constant, the amount of the indium ion beam rapidly decreases as the time passes.

But if the pre-annealing is carried out for around one hour at the mentioned temperature, the amount of the indium ion beam is stabilized for the above-mentioned reason. Thus, the pre-annealing is finished. Otherwise, if the pre-annealing is carried out as measuring the amount of the indium ion beam in the ion beam 30, the pre-annealing may be finished at the time to stabilize the amount of the indium ion beam in the ion beam 30. Depending on this way, the pre-annealing is more secured.

Figure 2:
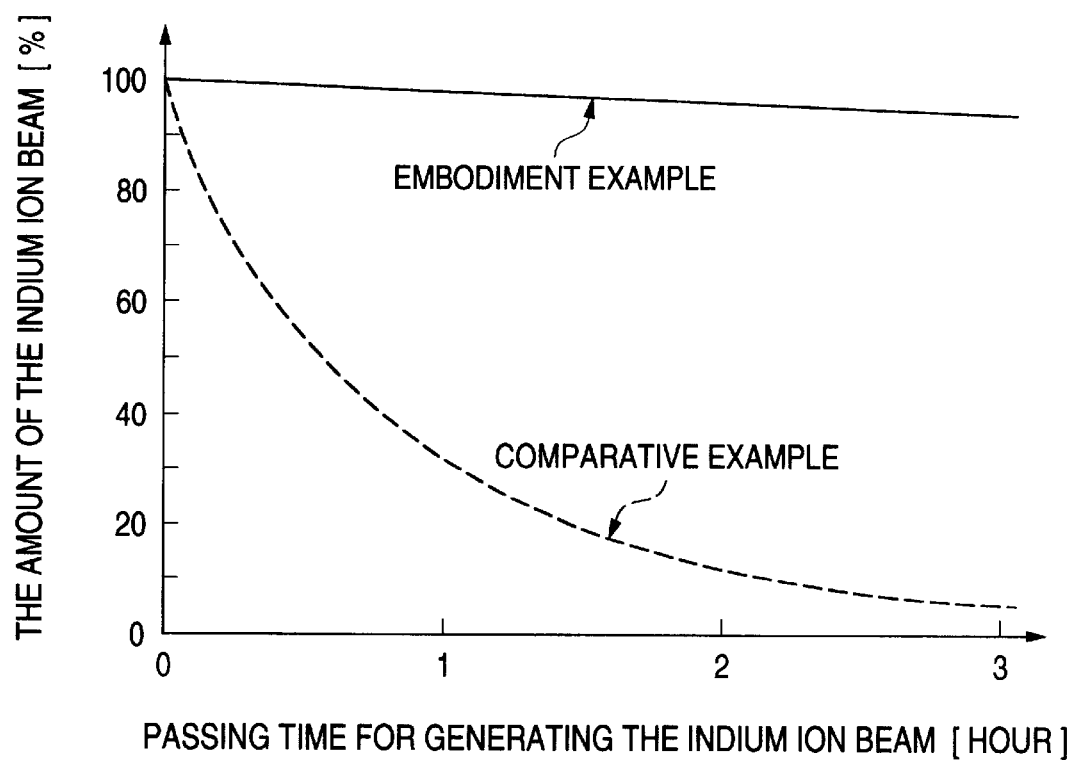
FIG. 2 is a graph showing one example of changes in the beam amount accompanied with the passing time from generating the indium ion beam when the temperature of the heating furnace keeps constant.

Thereafter, it is sufficient to perform the regular operation for generating the ion beam 30 containing the indium ion beam of the predetermined amount from the ion source 2. The control of the amount of the indium ion beam contained in the ion beam 30 mainly depends on the control of the annealing temperature of the heating furnace 4. The control device 40 may perform this control. Further, the control device 40 may perform the temperature control of the heating furnace 4 automatically, when the pre-annealing in heating furnace 4 is operated. By pre-annealing the indium trifluoride, the indium ion beam can be generated in the stable amount. For example, the embodiment example in FIG. 2 is shown that the indium trifluoride anhydride was used as the solid material 6 and the pre-annealing was performed at 650° C. for one hour. As a result, the amount of the indium ion beam generated from the ion source 2 is very stable as 10%/hour in the rate of change.

Accordingly, the control of the ion source 2, i.e., the control of the amount of the indium ion beam generated from the ion source 2, and the control of the amount of implanting the indium ion are very easy, whereby a practical utilization of the indium ion has been firstly possible.

At the regular operation, that is, when the indium ion beam of the predetermined amount is generated after pre-annealing, it is preferable to keep the temperature of the heating furnace 4 in the range of 600 to lower than 1170° C. The temperature is more preferably in the range of 600 to 700° C. for the same reason as the pre-annealing of the indium trifluoride.

The heating furnace 4 at the regular operation is preferably to keep in the range of 600 to lower than 1170° C. and at less than temperature of the plasma generator 16. In such a way, the steam pipe 10 connecting the heating furnace 4 and the plasma generator 16 is effected with a temperature gradient going up toward the plasma generator 16. The temperature gradient prevents the steam 8 generated in the heating furnace 4 from re-solidification within the steam pipe 10 and the plasma generator 16, thereby to avoid smudging of the plasma generator 16 and the steam pipe 10 or clogging of the steam pipe 10. The effect is available, even if difference is not so large between temperatures in the heating furnace 4 and the plasma generator 16. For example, the temperature difference may be around 10 to 20° C. The temperature control may be automatically carried out in this example by the control device 40.

It is found that water can be easily removed by annealing, after the water is absorbed by the indium trifluoride once heated at the above-mentioned temperature. For example, water is easily removed by the annealing at the time to generate the indium ion beam. If the water is absorbed, the water is difficult to be at the state of the combined molecule. That is, it is assumed that, as shown in the formula 1, the indium trifluoride is chemically changed into $In(OF)_xF_{3-x}$ by the annealing, and this $In(OF)_xF_{3-x}$ is less to be the combine molecule. Therefore, the pre-annealing is not again required.

So, the indium trifluoride, which is previously once heated at the above mentioned temperature in other place, may be brought into the heating furnace 4 in substitution for the pre-annealing in the heating furnace 4 as the above mentioned example.

Since the once heated indium trifluoride can easily remove the adhered water content. So, it is not always necessary to pass it through the vacuum and lead into the heating furnace 4. The once heated indium trifluoride is allowed to pass through the atmospheric air and lead into the heating furnace 4. Thus, treating is very easy.

The annealing as above-mentioned of the indium trifluoride is performed inside or outside of the heating furnace 4, as exhausting into the vacuum (for example, low vacuum of around $10^{-1}$ to $10^{-3}$ Pa). It is Preferably from the viewpoint of preventing dispersion of harmful substances, but no matter is about the atmosphere at annealing from the viewpoint of merely pre-annealing. For example, the annealing in the atmospheric air, the vacuum atmosphere or $N_2$ gas replacing atmosphere is sufficient.

$In(OF)_xF_{3-x}$ can be used as the solid material 6 to be introduced into the heating furnace 4 instead of the indium trifluoride, since $In(OF)_xF_{3-x}$ is made as shown in the formula 1 by the pre-annealing. In this case a similar effect is available. That is, the indium ion beam can be generated in a stable amount.

The invention does not take as a problem any generating means of the plasma 24 in the plasma generator 16. The invention can be broadly applied to many types of ion sources, the burnus-type ion source, for example, a freeman-type ion source using a filament shaped like at a bar, a bucket-type ion source using multi-pole magnetic field for shutting the plasma, a high frequency ion source using high frequency (including micro wave) for generating the plasma, or ECR type ion source using ECR (electron cyclotron resonance) for generating the plasma.

What is claimed is:

1. A method of generating an indium ion beam, comprising the steps of:
    a) annealing $In(OF)_xF_{3-x}$ (x=1, 2 or 3) in a heating furnace to generate a steam of said $In(OF)_xF_{3-x}$ (x=1, 2 or 3) in said heating furnace;
    b) ionizing said steam generated in said heating furnace in a discharge chamber to generate a plasma; and
    c) deriving an indium ion beam from said plasma.

2. The method of generating an indium ion beam according to claim 1, comprising the steps of:
    a') pre-annealing a solid material including an indium compound at a temperature in the range of 600 to less than 1170° C. to prepare said $In(OF)_xF_{3-x}$ (x=1, 2 or 3) in said heating furnace before step a).

3. The method of generating an indium ion beam according to claim 2, wherein said solid material is an indium trifluoride.

4. An ion source for generating an indium ion beam, comprising:
    a solid material including $In(OF)_xF_{3-x}$ (x=1, 2 or 3);
    a heating furnace for annealing said solid material to generate a steam therefrom; and
    a discharge chamber to generate a plasma for ionizing said steam of said solid material.

5. An apparatus for generating an indium ion beam, comprising:
    an ion source for generating said indium ion beam, said ion source including:
        a heating furnace for pre-annealing a solid material including an indium compound at a predetermined temperature for annealing said solid material to generate a steam of said solid material,
        a discharge chamber for ionizing said steam to generate a plasma; and
    a control device for controlling the pre-annealing temperature of said heating furnace in the range of 600 to less than 1170° C.

6. The apparatus for generating an indium ion beam according to claim 5, wherein said a control device controls the pre-annealing temperature in the range of 600 to less than 700° C.

7. The apparatus for generating an indium ion beam according to claim 6, wherein said device controls the pre-annealing time of said solid material between 30 minutes and 90 minutes.

8. The apparatus for generating an indium ion beam according to claim 5, wherein said solid material is an indium trifluoride.

9. The apparatus for generating an indium ion beam according to claim 5, wherein said solid material is an indium trifluoride anhydride.

* * * * *